(12) United States Patent
Yeo et al.

(10) Patent No.: US 9,263,414 B2
(45) Date of Patent: Feb. 16, 2016

(54) FLIP CHIP PACKAGING METHOD, AND FLUX HEAD MANUFACTURING METHOD APPLIED TO THE SAME

(71) Applicant: Samsung Electronics Co., Ltd., Suwon-Si, Gyeonggi-Do (KR)

(72) Inventors: Kyeong Min Yeo, Hwaseong-si (KR); Seung Min Ryu, Suwon-si (KR); Dae Jung Kim, Seoul (KR); Ji Ho Uh, Seoul (KR); Suk Won Lee, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 87 days.

(21) Appl. No.: 14/108,961

(22) Filed: Dec. 17, 2013

(65) Prior Publication Data

US 2014/0242753 A1   Aug. 28, 2014

(30) Foreign Application Priority Data

Feb. 27, 2013   (KR) ........................ 10-2013-0021093

(51) Int. Cl.
*H01L 21/44* (2006.01)
*H01L 23/00* (2006.01)
*H05K 3/34* (2006.01)
*B23K 1/00* (2006.01)
*B23K 1/20* (2006.01)

(52) U.S. Cl.
CPC .............. *H01L 24/81* (2013.01); *B23K 1/0016* (2013.01); *B23K 1/203* (2013.01); *H01L 24/75* (2013.01); *H05K 3/3489* (2013.01); *H01L 24/13* (2013.01); *H01L 2224/131* (2013.01); *H01L 2224/7501* (2013.01); *H01L 2224/81024* (2013.01); *H01L 2224/81191* (2013.01); *H01L 2224/81815* (2013.01); *H05K 2203/0108* (2013.01)

(58) Field of Classification Search
CPC ..... H05K 31/32; H05K 31/34; H05K 31/341; H05K 31/3478; H05K 31/3489; H01L 24/81; B23K 1/203; B23K 3/082
USPC ......................................... 438/108, 118, 119
See application file for complete search history.

(56) References Cited

U.S. PATENT DOCUMENTS

| | | | | |
|---|---|---|---|---|
| 5,676,305 | A | * | 10/1997 | Potter et al. .................... 228/207 |
| 5,816,481 | A | * | 10/1998 | Economy et al. ............. 228/207 |
| 6,146,698 | A | | 11/2000 | Groninger et al. |
| 6,296,169 | B1 | * | 10/2001 | Ong ................................ 228/36 |
| 7,374,417 | B2 | | 5/2008 | Kuwabara et al. |
| 7,655,307 | B2 | | 2/2010 | Kim et al. |
| 8,012,667 | B2 | | 9/2011 | Nam et al. |
| 2004/0169275 | A1 | * | 9/2004 | Danvir et al. .................. 257/737 |

(Continued)

FOREIGN PATENT DOCUMENTS

| | | |
|---|---|---|
| JP | 08266980 | 10/1996 |
| JP | 2004047874 A | 2/2004 |

(Continued)

*Primary Examiner* — Kevin M Picardat
(74) *Attorney, Agent, or Firm* — Harness, Dickey & Pierce, P.L.C.

(57) ABSTRACT

Flip chip packaging methods, and flux head manufacturing methods used in the flip chip packaging methods may be provided. In particular, a flip chip packaging method including printing flux on a pad of a printed circuit board (PCB), mounting the die in a flip chip manner on the PCB such that a bump of the die faces the pad of the PCB, and bonding the bump of the die to the pad of the PCB using the flux may be provided.

18 Claims, 13 Drawing Sheets

(56) References Cited

U.S. PATENT DOCUMENTS

| | | |
|---|---|---|
| 2004/0191700 A1 | 9/2004 | Kuwabara et al. |
| 2006/0290024 A1 | 12/2006 | Jo et al. |
| 2006/0290025 A1 | 12/2006 | Chae et al. |
| 2009/0000877 A1 | 1/2009 | Izard et al. |
| 2009/0036324 A1* | 2/2009 | Fan et al. ............ 506/9 |
| 2010/0096770 A1 | 4/2010 | Cho et al. |
| 2011/0233761 A1* | 9/2011 | Hwang et al. ......... 257/737 |
| 2013/0334291 A1* | 12/2013 | Eom et al. ........... 228/141.1 |

FOREIGN PATENT DOCUMENTS

| | | | |
|---|---|---|---|
| JP | 2005251830 A | 9/2005 |
| JP | 2010080865 A | 4/2010 |
| JP | 4473233 B2 | 6/2010 |
| JP | 2011108948 A | 6/2011 |
| KR | 19980085415 | 12/1998 |
| KR | 100206407 B1 | 7/1999 |
| KR | 20030003629 A | 1/2003 |
| KR | 100437278 | 2/2003 |
| KR | 100498560 | 1/2004 |
| KR | 0971952 | 3/2005 |
| KR | 20050050233 A | 5/2005 |
| KR | 100546408 B1 | 1/2006 |
| KR | 1117985 | 8/2006 |
| KR | 100699092 B1 | 3/2007 |
| KR | 20070031591 A | 3/2007 |
| KR | 100823699 B1 | 4/2008 |
| KR | 100830190 B1 | 5/2008 |
| KR | 100846827 B1 | 7/2008 |
| KR | 100879790 B1 | 1/2009 |
| KR | 100911897 B1 | 8/2009 |
| KR | 20090113681 A | 11/2009 |
| KR | 20100123303 A | 11/2010 |
| KR | 1089956 | 5/2011 |
| KR | 20110088645 A | 8/2011 |
| KR | 20110135777 A | 12/2011 |

* cited by examiner

FLIP CHIP PACKAGING METHOD, AND FLUX HEAD MANUFACTURING METHOD APPLIED TO THE SAME

CROSS-REFERENCE TO RELATED APPLICATIONS

This application claims the priority of Korean Patent Application No. 10-2013-0021093, filed on Feb. 27, 2013, in the Korean Intellectual Property Office, the entire disclosure of which is incorporated herein by reference.

BACKGROUND

1. Field

Example embodiments of the inventive concepts relate to flip chip packaging methods, and/or flux head manufacturing methods used in the flip chip packaging methods.

2. Description of the Related Art

A flip chip packaging used in a semiconductor industry is an assembly technology for mounting a die (e.g., semiconductor chip) on an electronic terminal in a flip chip manner for electrical connection. Conventional packaging technologies generally use a wire for wiring.

In the flip chip packaging, the wiring is achieved using a conductive bump on the surface of the die. The term "flip chip packaging" was derived from the die being flipped so that the bump formed on the die can be directly connected to a carrier.

Because the flip chip packaging has various advantages (e.g., improved thermal performance) compared with the wire bonding packaging, research and development of the flip chip packaging are being intensely conducted.

A general flip chip packaging can be carried out as follows.

First, a die may be separated from a wafer, and a bump of the die may be coated with flux by dipping the bump into the flux, e.g., smearing the bump of the die with the flux.

Then, the die may be aligned with a pad of a printed circuit board (PCB), and then mounted to the pad of the PCB in a flip chip manner.

Next, the PCB mounted with the die may be coupled through a reflow stage where the bump of the die and the pad of the PCB are bonded.

However, according to the general flip chip packaging process, the process of coating the bump of the die with the flux precedes the flip chip bonding process. Thus, productivity of the packaging process may decrease due to an increase in tact time.

SUMMARY

Some of example embodiments of the inventive concepts provide flip chip packaging methods in which a pre-fluxing process is applied and a process of coating a bump of a die with flux is omitted, which are capable of improving productivity due to a decrease in tact time.

Also, some of example embodiments of the inventive concepts provide flux head manufacturing methods applied to the flip chip packaging process including a pre-fluxing process, which are capable of improving an efficiency of the flip chip packaging process.

According to an example embodiment, a flip chip packaging method includes printing flux on a pad of a printed circuit board (PCB), mounting a die in a flip chip manner on the PCB such that a bump of the die faces the pad of the PCB, and bonding the bump of the die to the pad of the PCB using the flux.

The printing may include planarizing the flux contained in a flux storage.

The printing may include dipping pins of a flux head into the flux to coat the pins of the flux head with the flux contained in the flux storage.

The printing may further include printing the flux coated on one of the pins of the flux head on to the pad of the PCB.

According to an example embodiment of the inventive concepts, a flux head manufacturing method applied in a flip chip packaging method includes providing a master mold with at least one pin groove during a master mold preparing stage, forming a polydimethylsiloxane (PDMS) mold with a pin corresponding to the pin groove by supplying a liquid PDMS mixture to the master mold and hardening the liquid PDMS mixture, and attaching the PDMS mold to a plate.

The forming a PDMS mold may include supplying the liquid PDMS to the master mold and hardening the liquid PDMS to form a primary PDMS mold replica mixture.

The forming a PDMS mold may include arranging a glass fiber sheet in the primary PDMS mold replica.

The flux head manufacturing method may further include supplying the liquid PDMS mixture during on to the glass fiber sheet and hardened the liquid PDMS mixture to form the PDMS mold with the glass fiber sheet interposed therein.

The flux head manufacturing method may further include taking the PDMS mold out from the master mold before the attaching.

The flux head manufacturing method may further include turning over the PDMS mold is taken out from the master mold.

The attaching the PDMS mold to the plate uses the liquid PDMS mixture as an adhesive therebetween.

According to an example embodiment of the inventive concepts, a polydimethylsiloxane (PDMS) mold attaching device may include a mold support configured to supports the a PDMS mold, the PDMS mold being a replica of a master mold, the master mold including pin grooves and the PDMS mold including corresponding pins, and the PDMS mold being a hardened liquid PDMS mixture, and a plate support configured to support the plate, the plate configured to attach to the PDMS mold.

The mold support may include a vacuum chuck. The mold support may have a plurality of vacuum lines provided therein; and have pin accommodating portions corresponding to the pins of the PDMS mold.

The PDMS mold attaching device may further include a space adjusting block between the plate support and the mold support and configured to adjust a space therebetween, and the plate support and the mold support detachably coupled to the space adjusting block by a fastening member.

According to an example embodiment of the inventive concepts, a method of preparing a flux head coated with flux may include providing a flux head including a base and pins protruding from the base, planarizing flux contained in a flux storage, and coating the pins with the planarized flux.

The planarizing may be performed using a blade disposed on the flux storage.

The blade may be configured to move from one side to the other side of the flux storage.

The coating may include dipping pins defined in a flux head into the planarized flux, and pulling the flux coated pins out.

The providing a flux head may include forming a polydimethylsiloxane (PDMS) mold by supplying a PDMS mixture to a master mold having pin grooves and hardening the PDMS mixture to form the PDMS mold, and attaching the PDMS mold to a plate.

The providing a flux head may include providing an elastic member in the PDMS mixture such that the base of the flux head is contraction-resistive.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

The attached drawings for illustrating example embodiments of the inventive concepts are included to provide a further understanding of example embodiments of the inventive concepts. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity.

Hereinafter, example embodiments the inventive concepts will be described in detail with reference to the attached drawings. Like reference numerals in the drawings denote like elements throughout, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As described above, even though the flip chip packaging is excellent in various performances, e.g., thermal performance as compared with the wire bonding packaging, a process of coating a bump of a die with flux preceding the flip chip packaging process may increase tact time, thereby decreasing productivity of the flip chip packaging process.

To address this issue, a pre-fluxing process may be used according to an example embodiment.

The pre-fluxing process may be a process of printing flux on a pad of a printed circuit board (PCB) prior to performing a flip chip bonding, which will be described later.

If the flux is pre-printed on the pads of the PCB and is put into the flip chip packaging process, the process of coating the bump of the die with flux can be omitted, thereby improving productivity due to a decrease in tact time.

As the density of a die increases, however, the size of the pad of the PCB as well as the size of the PCB becomes smaller, and pre-printing the flux on the smaller pad of the smaller PCB becomes more demanding.

For convenience of description, the flip chip packaging method will be described with reference to FIGS. 1 to 4, and then the flux head manufacturing method will be described with reference to FIGS. 5 to 13.

Figure 1:
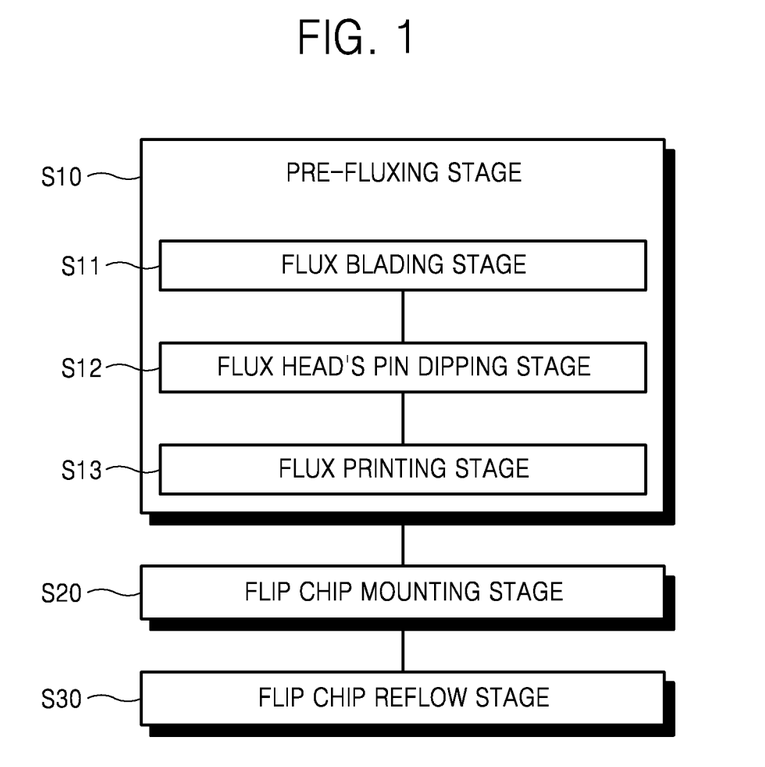
FIG. 1 is a flowchart of a flip chip packaging method according to an example embodiment of the inventive concepts.
Figure 2:
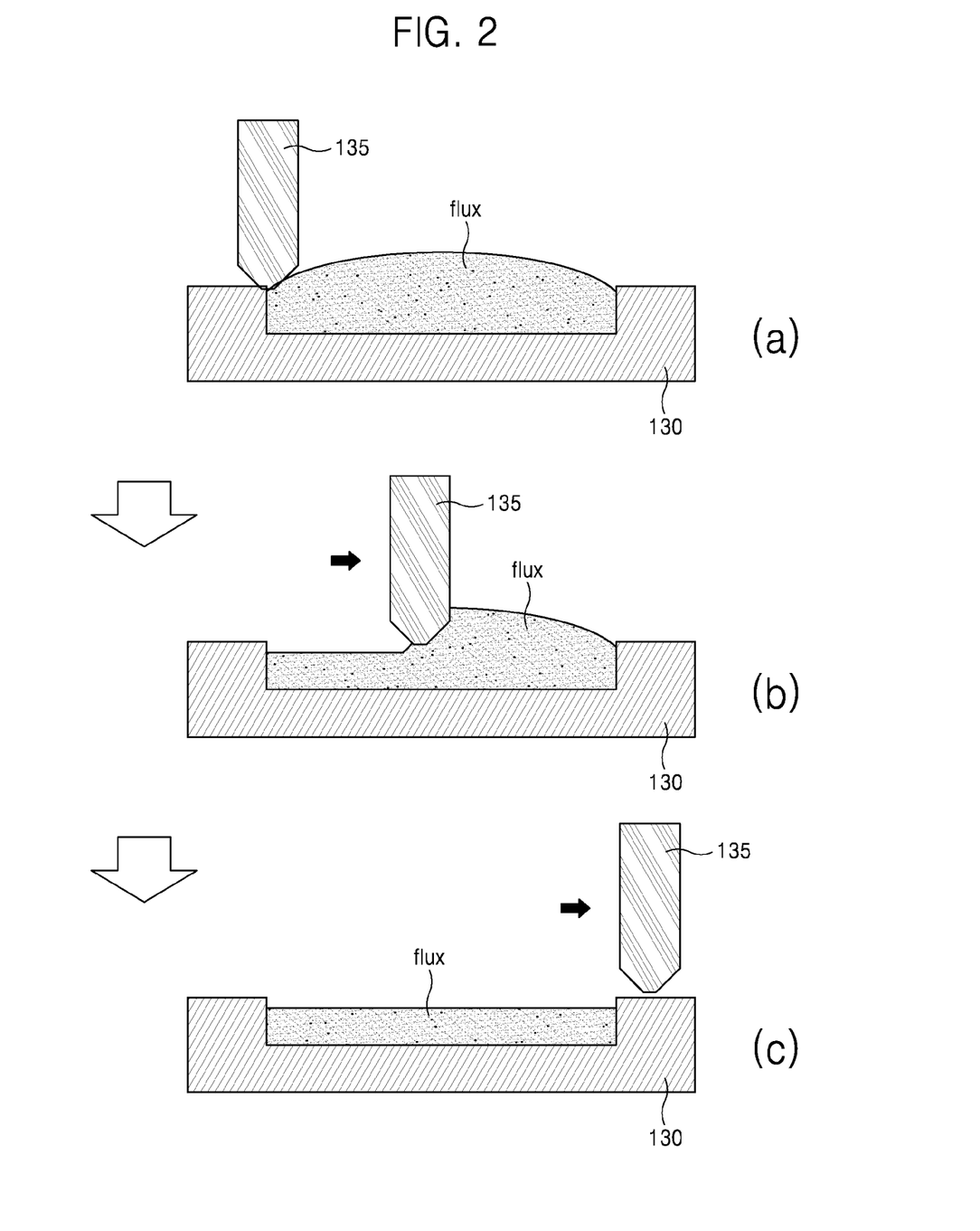
FIG. 2 illustrates individual processes of a flux blading stage.
Figure 3:
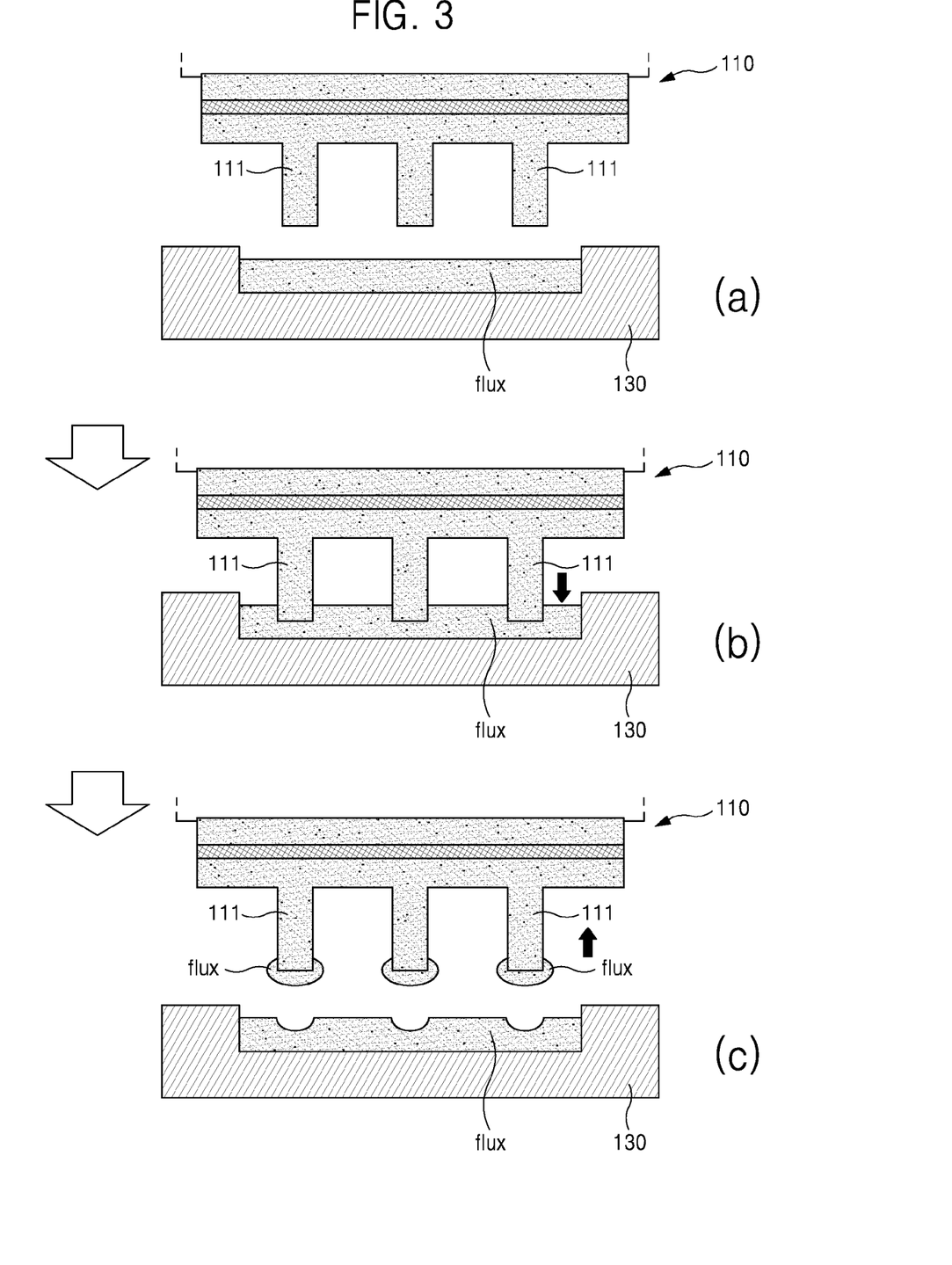
FIG. 3 illustrates individual processes of a flux head's pin dipping stage.
Figure 4:
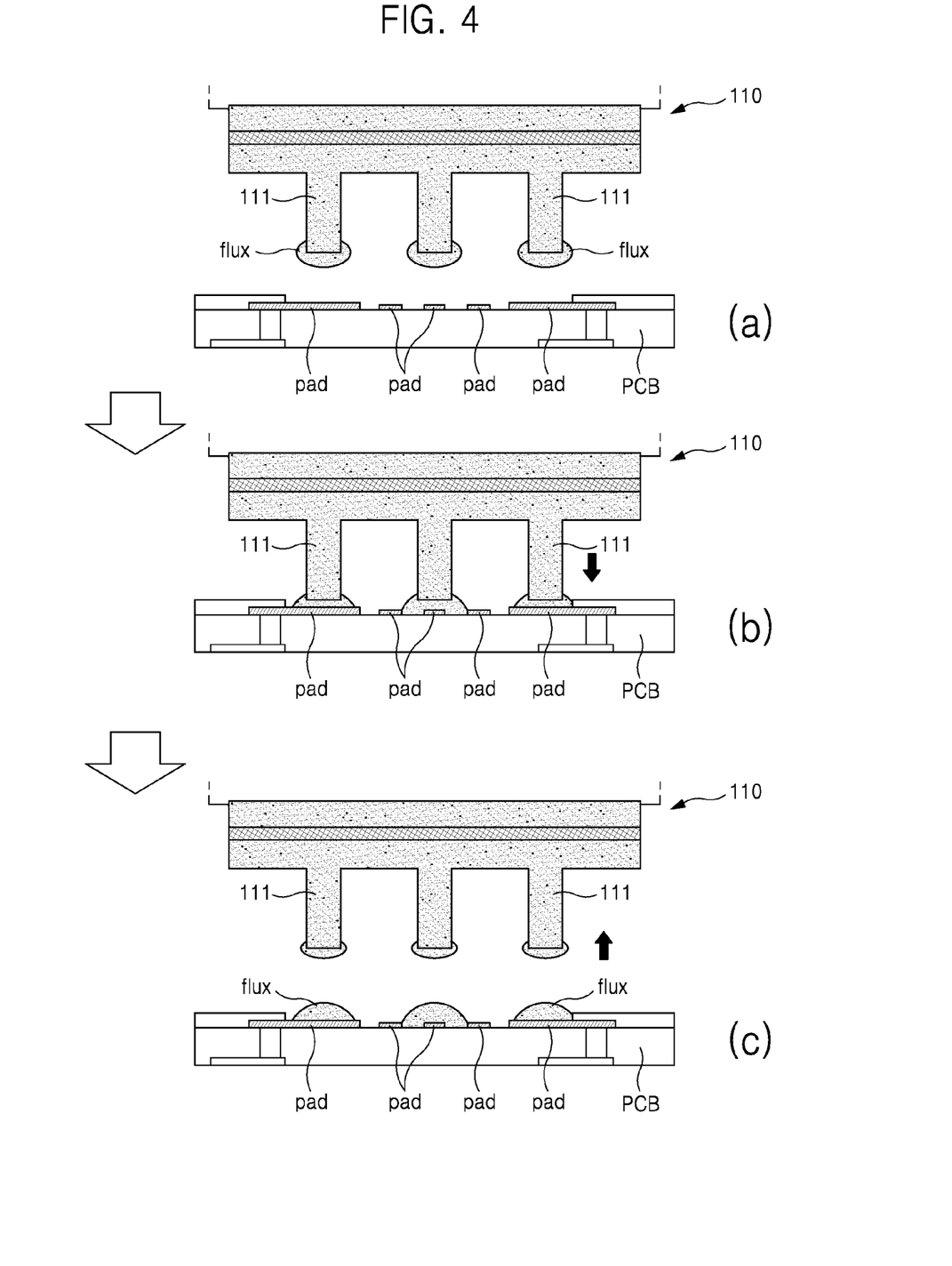
FIG. 4 illustrates individual processes of a flux printing stage.

FIG. 1 is a flowchart of a flip chip packaging method according to an example embodiment of the inventive concepts, FIG. 2 illustrates individual processes of a flux blading stage, FIG. 3 illustrates individual processes of a flux head's pin dipping stage, and FIG. 4 illustrates individual processes of a flux printing stage.

Referring to FIG. 1, the flip chip packaging method according to an example embodiment includes a pre-fluxing stage S10, a flip chip mounting stage S20, and a reflow stage S30.

First, the pre-fluxing stage S10 is a stage of previously printing a desired (or alternatively, predetermined) amount of flux onto the pad of the PCB as described above.

In this disclosure, flux is a metallurgy term referring to a solvent. For example, chloride, fluoride, resin, etc. may be used as flux to reduce or prevent a bonding surface from being oxidized and helps complete the bonding when the die is bonded in a flip chip manner.

The pre-fluxing stage S10 may include a flux blading stage S11, a flux head's pin dipping stage S12, and a flux printing stage S13.

Referring to FIG. 2, the flux blading stage S11 is a process for planarizing the flux in a flux storage 130 using a blade 135.

For example, the blade 135 disposed on the top of the flux storage 130 as shown in (a) of FIG. 2. As shown in (b) and (c) of FIG. 2, the blade 135 may move from one side to the other side of the flux storage 130, thereby planarizing the flux to have a uniform height in the flux storage 130.

In order to coat every pin 111 with the same amount of flux and achieve a high quality when the plurality of pins 111 is dipped into the flux, planarizing the flux may be beneficial.

Referring to FIG. 3, the pin dipping stage S12 is a process of dipping the pins 111 of the flux head 110 into the flux, which was, for instance, previously planarized within the flux storage 130, such that the pins 111 of the flux head 110 can be coated with the flux.

As shown in (a) of FIG. 3, the flux head 110 may be disposed above the flux storage 130. As shown in (b) of FIG. 3, the flux head 110 may move down such that the pins 111 of the flux head 110 can contact or dip into the flux. Then, as shown in (c) of FIG. 3, the flux head 110 may move up to achieve the pins 111 of the flux head 110 coated with the flux. In this disclosure, the term "coating" may refer to a state where the smeared flux is not solidified.

Referring to FIG. 4, the flux printing stage S13 is a process for printing the flux coated on the pins 111 of the flux head 110 on the pad of the PCB.

As shown in (a) of FIG. 4, the flux head 110 may be disposed above the PCB. Referring to (b) of FIG. 4, the flux head 110 may move down such that the flux coated on the pins 111 of the flux head 110 can be printed on the pad of the PCB. When the printing process is completed, the flux head 110 may move up to its original position as shown in (c) of FIG. 4.

The flip chip mounting stage S20 refers to a process where the bump of a die is mounted on to the pad of the PCB in a flip chip manner after aligning the die with the flux-printed pad of the PCB.

At this stage, the bump of the die may be mounted to the flux-printed pad of the PCB.

The reflow stage S30 refers to a process for bonding the bump of the die and the pad of the PCB together by the flux printed on the pad of the PCB.

The term "reflow" may refer to a thermal process hardening previously applied flux, and soldering may refer to a process of using a soldering iron or the like, which are not particularly described herein.

As described above, the flux may be previously printed on the pad of the PCB through the pre-fluxing process, the bump of the die may be mounted on the flux-printed pad of the PCB, and the reflow may be performed. Accordingly, the process of coating the bump of the die with the flux may be omitted, thereby improving productivity due to a decrease in tact time.

Meanwhile, the foregoing pre-fluxing process may be generally applied to a solder ball process, which includes ink jet printing, ultrasonic spray coating, pad printing, stencil printing, flux transfer method, etc.

Among the foregoing methods, the flux transfer method may be used as the pre-fluxing method due to its relatively fast printing speed, and its relatively easy control of the optimum amount of dispensed flux considering the size of the die.

In the flux transfer method used for the pre-fluxing process, the pins 111 provided in the flux head 110 may be precise and highly-integrated to print a flux pattern of high quality on the pad of the PCB. Accordingly, there has been a demand for easy and/or precise methods of manufacturing the flux head 110.

For example, the flux head 110 provided with a plurality of pins 111, as shown in FIGS. 3 and 4, may be manufactured by machine work, e.g., an injection molding.

However, the machine work may have a limit in reducing the size of the pin 111 and/or achieving high integration. Accordingly, it may be difficult to print a fine pattern of the flux on the pad of the PCB.

Hereinafter, a flux head manufacturing method according to an example embodiment will be described.

Figure 5:
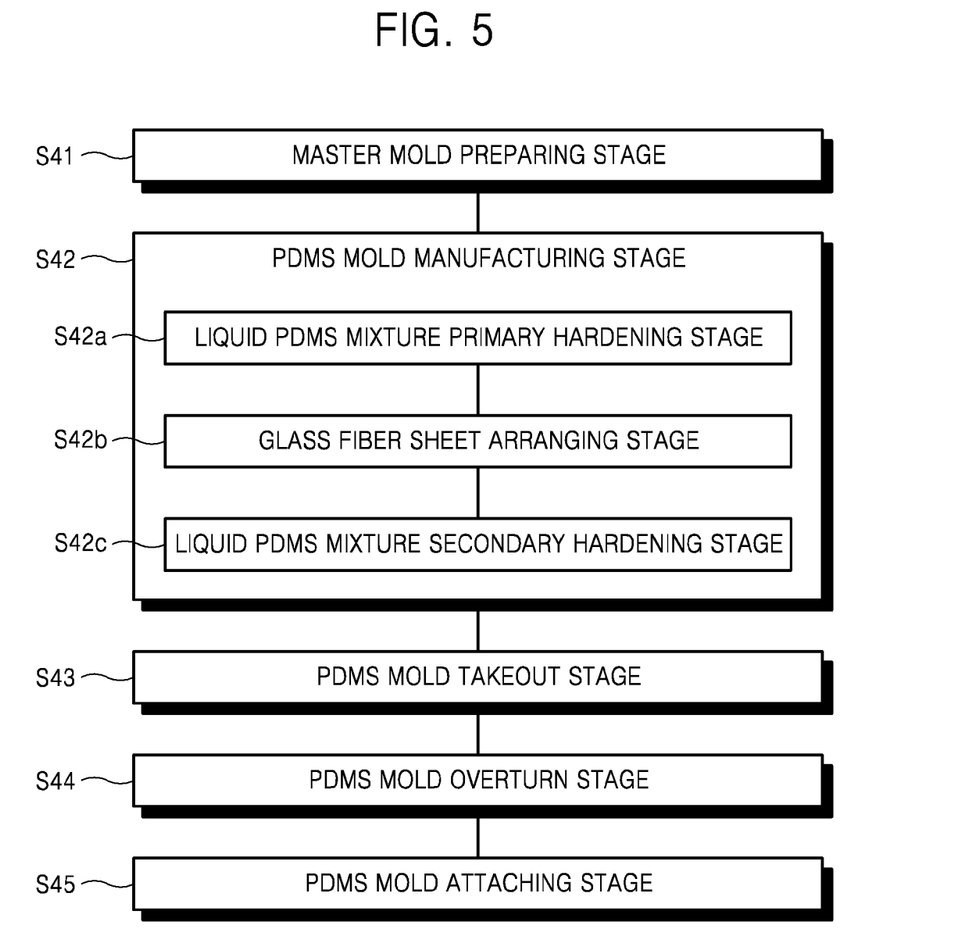
FIG. 5 is a flowchart of a flux head manufacturing method according to an example embodiment of the inventive concepts.
Figure 12:
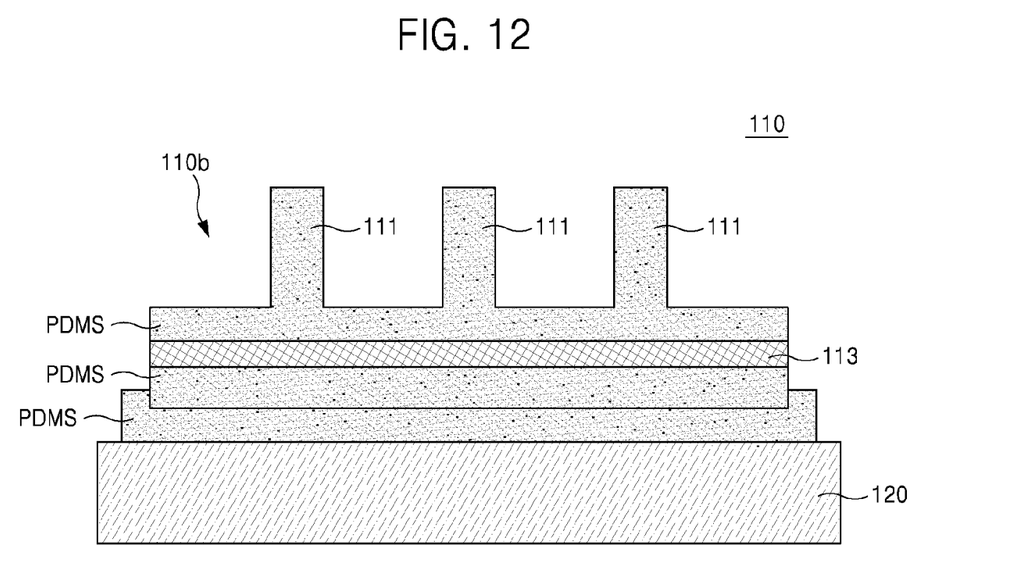
Figure 13:
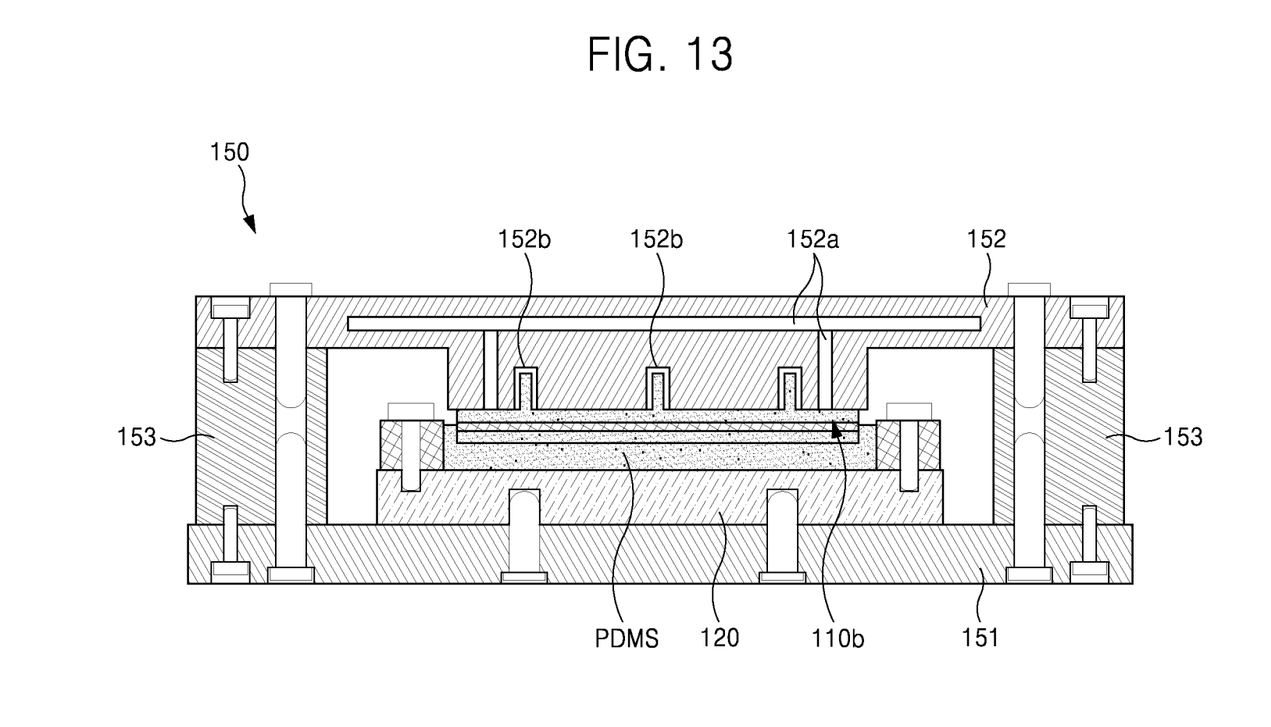
FIG. 13 shows a structure of a polydimethylsiloxane (PDMS) mold attaching device.

FIG. 5 is a flowchart of a flux head manufacturing method according to an example embodiment of the inventive concepts. FIGS. 6 to 12 illustrate individual processes of the respective stages of the flux head manufacturing method, and FIG. 13 shows a structure of a polydimethylsiloxane (PDMS) mold attaching device.

Referring to FIG. 5, the flux head manufacturing method may include a master mold preparing stage S41, a PDMS mold manufacturing stage S42, a PDMS mold takeout stage S43, a PDMS mold overturn stage S44, and a PDMS mold attaching stage S45.

Figure 6:
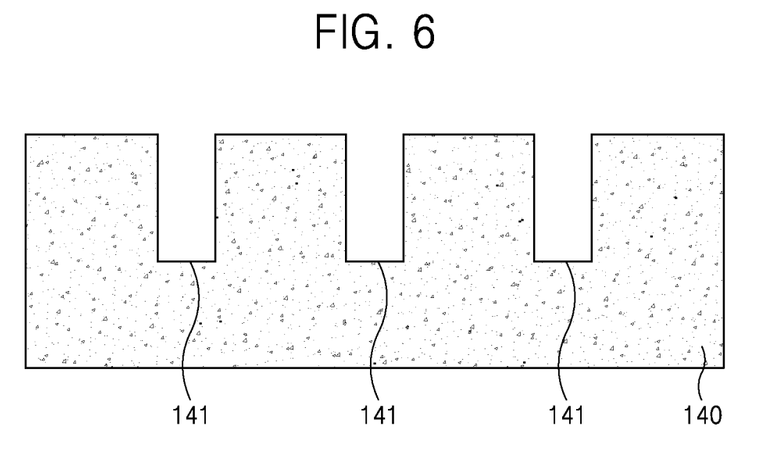
FIGS. 6 to 12 illustrate individual processes of the respective flux head manufacturing stages.

The master mold preparing stage S41 is a process of preparing a master mold 140 as shown in FIG. 6.

The master mold 140 may be a kind of mold frame. The master mold 140 may include pin grooves 141 defined therein and corresponding to the pins 111 of the flux head 110 to be formed.

The PDMS mold manufacturing stage S42 refers to a process of manufacturing a PDMS mold 110b. In this disclosure, the PDMS mold 110b may refer to a replica made by supplying a liquid polydimethylsiloxane (PDMS) material to the master mold 140 and hardening the liquid PDMS material. Referring to FIG. 12, an aluminum plate 120 coupled to the PDMS mold 110b may be referred to as the flux head 110.

The PDMS mold 110b may further include a glass fiber sheet 113, which will be described later.

In this example embodiment, the PDMS mold manufacturing stage S42 refers to a process where a liquid PDMS mixture is supplied to and hardened in the master mold 140 so as to manufacture the PDMS mold 110b for forming the pins 110 corresponding to the pin grooves 141.

The PDMS mold manufacturing stage S42 may include a liquid PDMS mixture primary hardening stage S42a, a glass fiber sheet arranging stage S42b, and a liquid PDMS mixture secondary hardening stage S42c.

For reference, the PDMS may have the following characteristics as a material with certain elasticity.

The PDMS may be stably adhered to a large surface of the master mold 140 due to its physical characteristics. Even in the case that the master mold 140 has an uneven surface, the PDMS may be stably adhered to the large surface of the master mold 140.

Also, the PDMS may have a relatively low interfacial free energy. Thus, the PDMS may be relatively well-adhered to a different polymer to be applied thereon.

Further, due to its long-term durability, the PDMS may be less susceptible to wear-and-tear.

Figure 7:
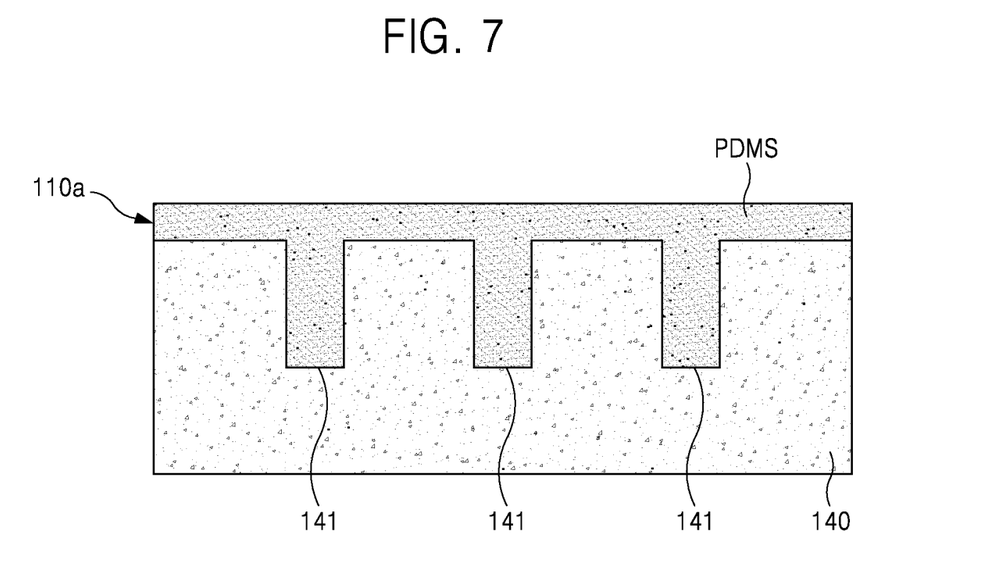

The liquid PDMS mixture primary hardening stage S42a refers to a process of supplying the liquid PDMS mixture to the master mold 140 and hardening it to manufacture a primary PDMS mold replica 110a as shown in FIG. 7. At this stage, the liquid PDMS mixture may not be completely hardened.

At this stage, the liquid PDMS mixture may be supplied and hardened by removing air from the pattern of the master mold 140 within a separate vacuum chamber. During the liquid PDMS mixture primary hardening stage S42a, the pins 111 may be formed.

Figure 8:
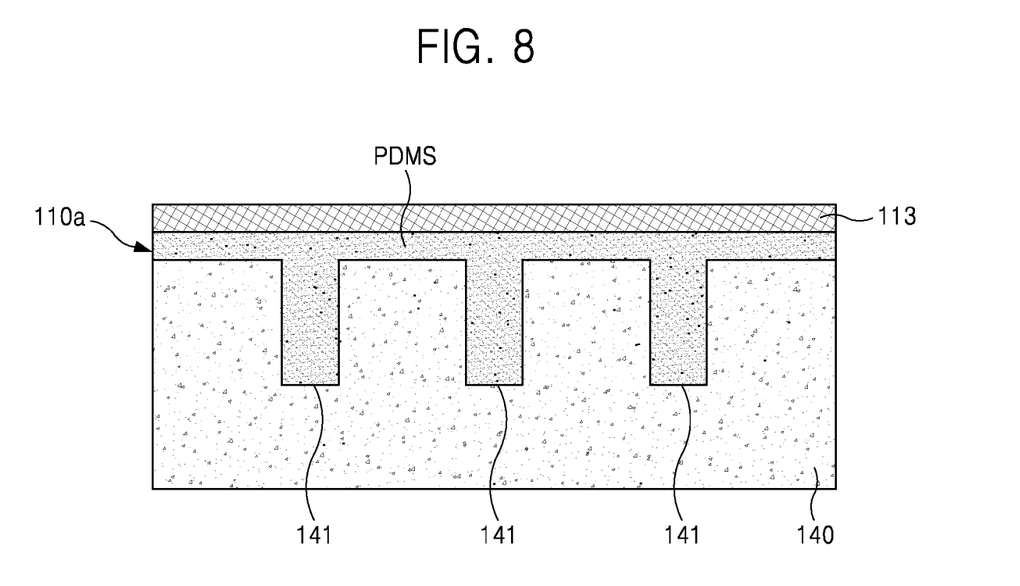

The glass fiber sheet arranging stage S42b refers to a process of arranging a glass fiber sheet 113 in a primary PDMS mold replica 110a, as shown in FIG. 8.

The glass fiber sheet 113 may be pressed against the master mold 140 so that the glass fiber sheet 113 can be arranged as closely to the master mold 140 as possible.

The glass fiber sheet 113, which may include a woven glass fiber, may reduce or prevent the PDMS from contracting after the subsequent hardening process, and thus may improve dimensional precision of the flux head 110.

Figure 9:
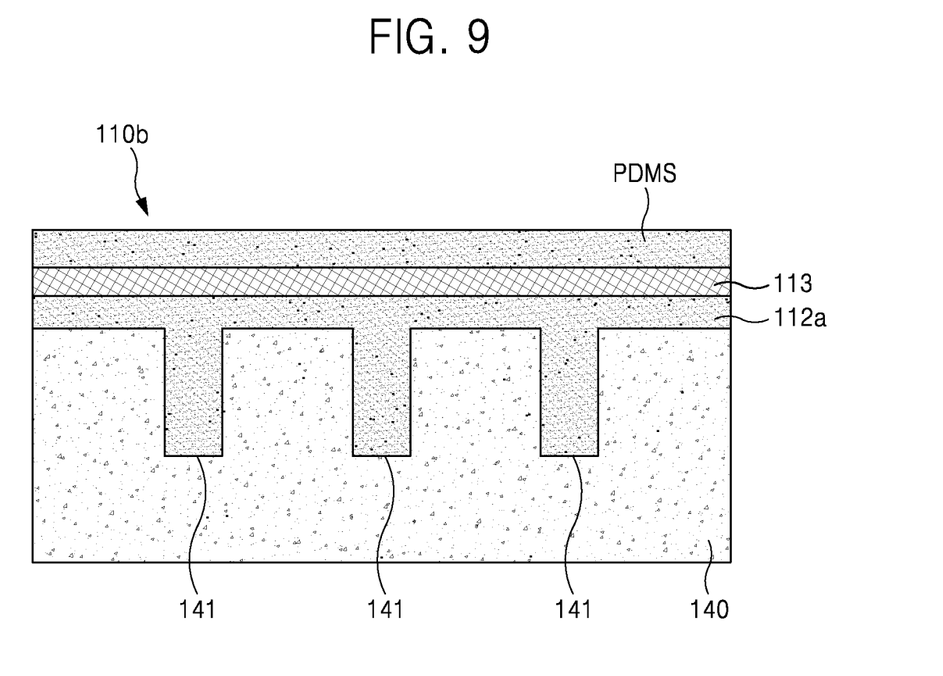

The liquid PDMS mixture secondary hardening stage S42c refers to a process where the liquid PDMS mixture is further supplied onto the glass fiber sheet 113 and hardened so that the PDMS mold 110b can be manufactured with the glass fiber sheet 113 interposed therein.

At this stage, an oven or a hot plate may be used to heat the liquid PDMS mixture, for instance, at about 45° C. for about 20 hours to harden the liquid PDMS mixture. When the hardening is completed, the glass fiber sheet 113 inside the liquid PDMS mixture may also be adhered to as arranged.

Figure 10:
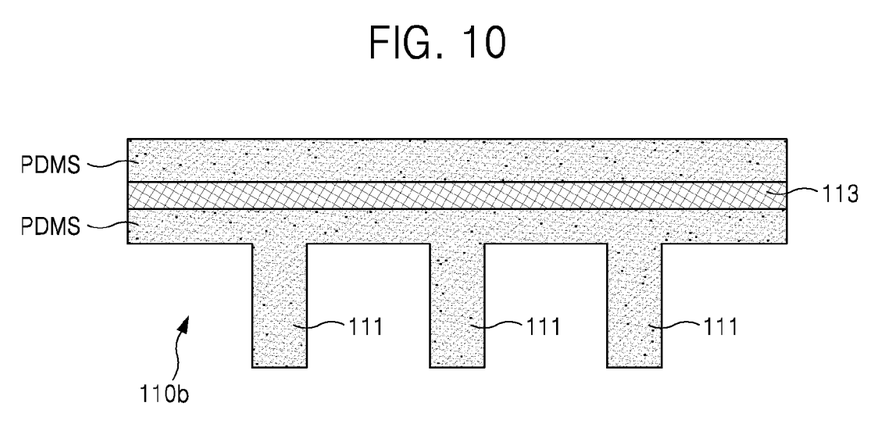

Referring to FIG. 10, the PDMS mold takeout stage S43 is a process where the PDMS mold 110b is taken out from the master mold 140.

Figure 11:
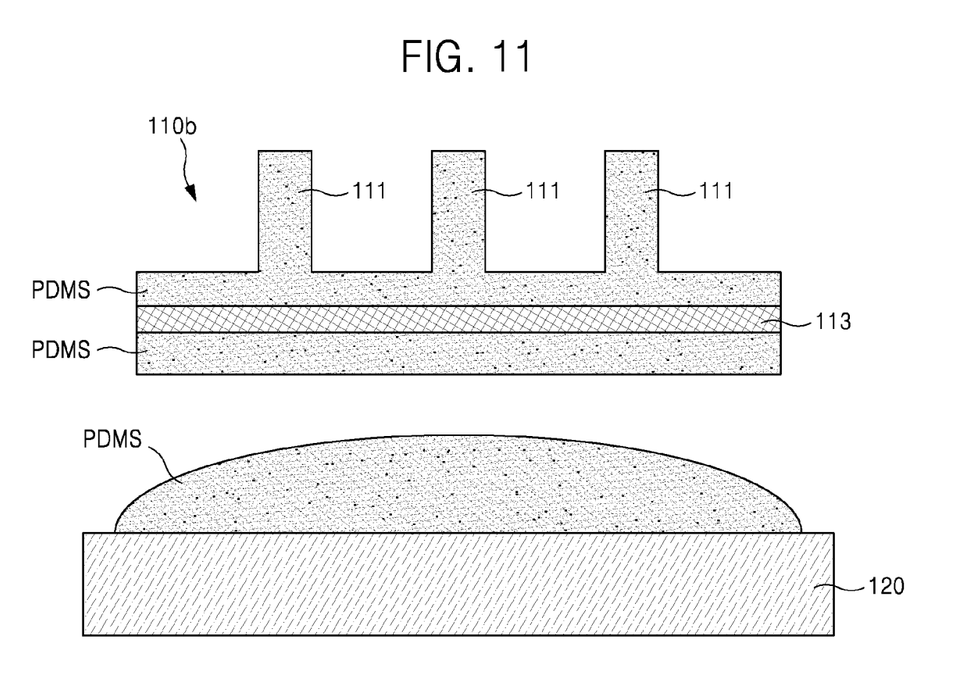

Referring to FIG. 11, the PDMS mold overturn stage S44 is a process where the taken-out PDMS mold 110b is turned over to couple with a plate 120 in pre-fluxing facilities, for example, the plate 120 may be made of aluminum.

Referring to FIG. 12, the PDMS mold attaching stage S45 is a process where the PDMS mold 110 is attached to the plate 120 of the pre-fluxing facilities, thereby completing the flux head 110.

When the PDMS mold 110b is attached to the plate 120, the PDMS mold attaching device 150 as shown in FIG. 13 may be used. At this stage, the liquid PDMS mixture may also be used as an adhesive between the PDMS mold 110b and the plate 120.

The PDMS mold attaching device 150 may include a plate support 151 configured to support the plate 120, and a mold support 152 configured to support the PDMS mold 110b.

The mold support 152 may include a vacuum chuck, which supports or adsorbs the PDMS mold 110b using vacuum. In the case that the vacuum chuck is used as the mold support 152, the PDMS mold 110b may be less susceptible to, for instance, a chuck impression defect.

The vacuum chuck 152 may include a plurality of vacuum lines 152a arranged therein. Further, the mold support 152 may be formed with a pin accommodating portions 152b corresponding to the pins 111 of the PDMS mold 110b. The pin accommodating portion 152b may reduce or prevents the pins 111 of the PDMS mold 110b from being broken or damaged.

Further, a space adjusting block 153 may be provided between the plate support 151 and the mold support 152 and may adjust the space between the plate support 151 and the mold support 152.

At least one of the plate support 151 and the mold support 152 may be detachably coupled to the space adjusting block 153 by a fastening member, e.g., a screw.

When the plate 120 and the PDMS mold 110b are attached through the PDMS mold attaching device 150, a hot plate may be additionally used because the mold support 152 is internally formed with the vacuum line 152a. For example, heat may be applied through the hot plate, for instance, at about 45° C. for about 20 hours. Accordingly, the liquid PDMS mixture may be hardened such that the flux head 110, which includes the plate 120 and the PDMS mold 110b, are attached to each other by the liquid PDMS mixture.

As described above, the flux head 110 manufactured according to example embodiments may be applied to a flip chip packaging process including a pre-fluxing process, thereby improving an efficiency of the flip chip packaging process.

In particular, when the glass fiber sheet 113 is interposed or included in the PDMS mixture to manufacture the flux head 110 provided with the pins 111, the flux head 110 may not include any separate elastic member because the glass fiber sheet 113 included in the PDMS mixture provides elasticity after hardening the PDMS mixture.

According to example embodiments of the inventive concepts, a pre-fluxing process may be used and a process of coating a bump of a die with flux may be omitted. Thus, overall productivity of the flip chip packaging process may be improved due to a decrease in tact time.

Also, according to example embodiments of the inventive concepts, a flux head manufacturing method may be applied to a flip chip packaging process including a pre-fluxing process and thus improve an efficiency of the flip chip packaging process.

While example embodiments of the inventive concepts have been particularly shown and described with reference to the example embodiments thereof, it will be understood that various changes in form and details may be made therein without departing from the spirit and scope of the following claims.

What is claimed is:

1. A flip chip packaging method comprising:
providing a flux head, the flux head having a base and pins protruding therefrom, the flux head including an elastic member in a PDMS mixture;

printing, using the pins of the flux head that are coated with a flux, the flux on a pad of a printed circuit board (PCB);

mounting a die in a flip chip manner on the PCB such that a bump of a die faces the pad of the PCB; and bonding the bump of the die to the pad of the PCB using the flux.

2. The flip chip packaging method according to claim 1, wherein the elastic member is a glass fiber sheet.

3. The flip chip packaging method according to claim 1, wherein the printing includes planarizing the flux contained in a flux storage.

4. The flip chip packaging method according to claim 3, wherein the printing includes dipping pins of a flux head into the flux to coat the pins of the flux head with the flux contained in the flux storage.

5. The flip chip packaging method according to claim 4, wherein the printing further includes printing the flux coated on one of the pins of the flux head on to the pad of the PCB.

6. A flux head manufacturing method applied in a flip chip packaging method, the method comprising:

providing a master mold with at least one pin groove;

forming a polydimethylsiloxane (PDMS) mold with a pin corresponding to the pin groove by supplying a liquid PDMS mixture to the master mold and hardening the liquid PDMS mixture, the forming a PDMS molding including, supplying the liquid PDMS to the master mold and hardening the liquid PDMS to form a primary PDMS mold replica mixture, arranging a glass fiber sheet in the primary PDMS mold replica, and attaching the PDMS mold to a plate.

7. The method according to claim 6, further comprising:

supplying the liquid PDMS mixture on to the glass fiber sheet and hardening the liquid PDMS mixture to form the PDMS mold with the glass fiber sheet interposed therein.

8. The method according to claim 6, further comprising:

taking the PDMS mold out from the master mold before the attaching.

9. The method according to claim 8, further comprising:

turning over the PDMS mold taken out from the master mold.

10. The method according to claim 6, wherein the attaching the PDMS mold to the plate uses the liquid PDMS mixture as an adhesive therebetween.

11. A polydimethylsiloxane (PDMS) mold attaching device, the device comprising:

a mold support configured to support a PDMS mold, the PDMS mold being a replica of a master mold, the master mold including pin grooves and the PDMS mold including corresponding pins, and the PDMS mold being a hardened liquid PDMS mixture; and a plate support configured to support a plate, the plate configured to attach to the PDMS mold.

12. The PDMS mold attaching device according to claim 11, wherein the mold support includes a vacuum chuck, the mold support having a plurality of vacuum lines provided therein and having pin accommodating portions corresponding to the pins of the PDMS mold.

13. The PDMS mold attaching device according to claim 11, the device further comprising:

a space adjusting block between the plate support and the mold support and configured to adjust a space therebetween, and the plate support and the mold support detachably coupled to the space adjusting block by a fastening member.

14. A method of preparing a flux head coated with flux, the method comprising:

providing a flux head including a base and pins protruding from the base, the providing a flux head including forming a polydimethylsiloxane (PDMS) mold by, supplying a PDMS mixture to a master mold having pin grooves, hardening the PDMS mixture to form the PDMS mold, and attaching the PDMS mold to a plate;

planarizing flux contained in a flux storage; and coating the pins with the planarized flux.

15. The method according to claim 14, wherein the planarizing is performed using a blade disposed on the flux storage.

16. The method according to claim 15, wherein the blade configured to move from one side to the other side of the flux storage.

17. The method according to claim 14, wherein the coating includes, dipping pins defined in a flux head into the planarized flux, and pulling the flux coated pins out.

18. The method according to claim 14, wherein the providing a flux head includes providing an elastic member in the PDMS mixture such that the base of the flux head is contraction-resistive.

* * * * *